(12) United States Patent
Tai et al.

(10) Patent No.: US 12,476,126 B2
(45) Date of Patent: Nov. 18, 2025

(54) WAFER HOLDER ASSEMBLY

(71) Applicant: TAIWAN SEMICONDUCTOR MANUFACTURING COMPANY LTD., Hsinchu (TW)

(72) Inventors: Cheng-You Tai, Taipei (TW); Ling-Sung Wang, Tainan (TW); Chen-Chieh Chiang, Kaohsiung (TW); Jung-Chi Jeng, Tainan (TW); Yi Ping Chao, Tainan (TW); Zhi-Hong Chung, Pingtung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 168 days.

(21) Appl. No.: 18/343,735

(22) Filed: Jun. 28, 2023

(65) Prior Publication Data

US 2025/0006528 A1  Jan. 2, 2025

(51) Int. Cl.
*H01L 21/673* (2006.01)
*C23C 16/458* (2006.01)

(52) U.S. Cl.
CPC .... *H01L 21/67309* (2013.01); *C23C 16/4586* (2013.01); *C23C 16/4584* (2013.01)

(58) Field of Classification Search
CPC ......... H01L 21/67309; H01L 21/68764; C23C 16/4586; C23C 16/4584
USPC ............................................. 206/710; 211/40
See application file for complete search history.

(56) References Cited

U.S. PATENT DOCUMENTS

| | | | | |
|---|---|---|---|---|
| 4,676,008 | A | * | 6/1987 | Armstrong ........ H01L 21/67313 211/41.18 |
| 2012/0258414 | A1 | * | 10/2012 | Matsuura .......... H01L 21/67303 432/5 |
| 2018/0105936 | A1 | * | 4/2018 | Nagano ............... H01L 21/0217 |

* cited by examiner

*Primary Examiner* — Andrew D Perreault
(74) *Attorney, Agent, or Firm* — WPAT Law; Anthony King

(57) ABSTRACT

A container for receiving a semiconductor device is provided. In one embodiment, the wafer holder assembly includes a first wafer holder with a plurality of first fingers arranged in a first common horizontal plane and a second wafer holder with a plurality of second fingers arranged in a second common horizontal plane. The first wafer holder and the second holder are configured to move relative to each other in a vertical direction, and the first wafer holder and the second holder are configured to rotate relative to each other around a vertical axis.

20 Claims, 19 Drawing Sheets

WAFER HOLDER ASSEMBLY

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. The uniformity of the layers deposited on the semiconductor substrate is affected and controlled by regulating process parameters such temperature of the wafer, reaction chamber pressure, flow path and rate of reactant gases, process time or duration, and other factors. It would be desirable to provide a solution for depositing layers for use in a wafer process apparatus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
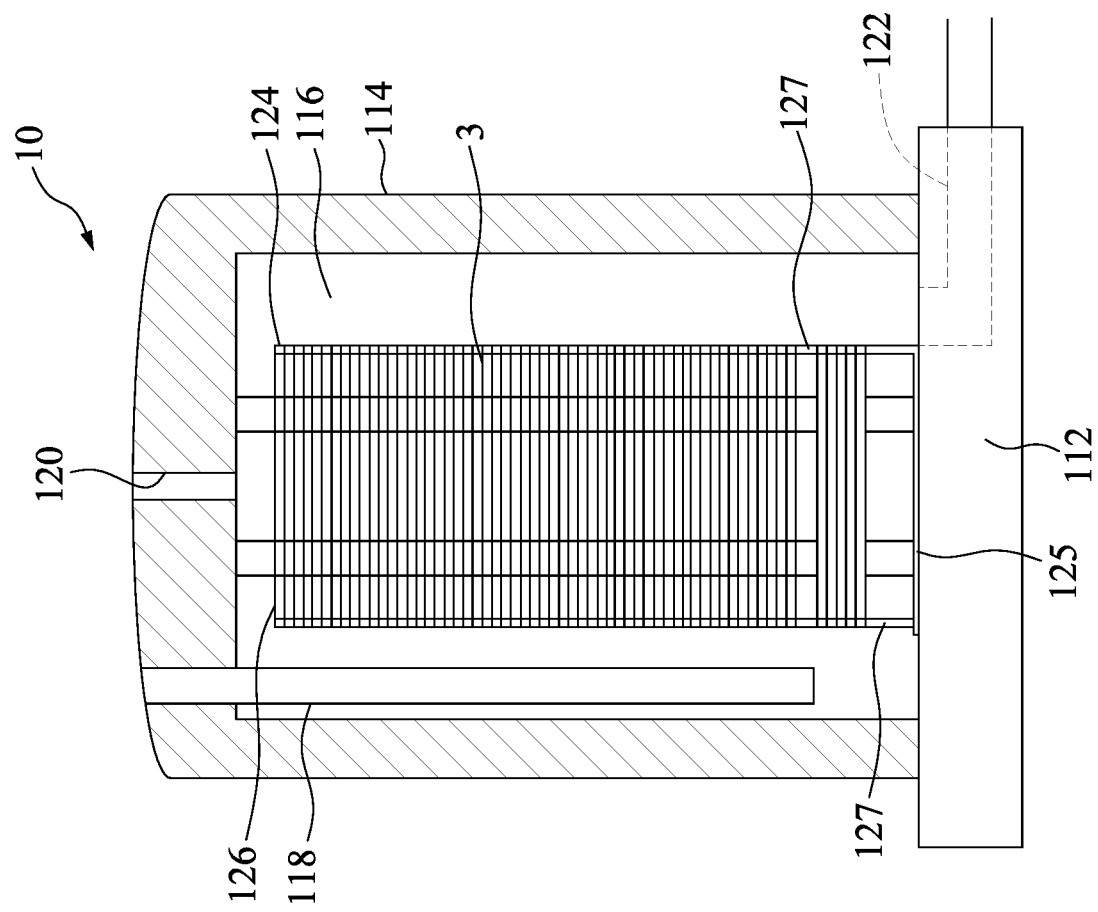
FIG. 1A is a sectional view of a typical LPCVD process furnace.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Chemical vapor deposition (CVD) processes are widely used to form layers of materials on a semiconductor wafer. CVD processes include thermal deposition processes, in which a gas is reacted with the heated surface of a semiconductor wafer substrate, as well as plasma-enhanced CVD processes, in which a gas is subjected to electromagnetic energy in order to transform the gas into a more reactive plasma. Forming a plasma can lower the temperature required to deposit a layer on the wafer substrate, to increase the rate of layer deposition, or both. Other CVD processes include APCVD (atmospheric pressure chemical vapor deposition), and LPCVD (low pressure chemical vapor deposition). While APCVD systems have high equipment throughput, good uniformity and the capability to process large-diameter wafers, APCVD systems consume large quantities of process gas and often exhibit poor step coverage. Currently, LPCVD is used more often than APCVD because of its lower cost, higher production throughput and superior film properties. LPCVD is commonly used to deposit nitride, TEOS oxide and polysilicon films on wafer surfaces for front-end-of-line (FEOL) processes.

An example of a vertical LPCVD furnace is generally indicated by reference numeral 10 in FIG. 1A and includes a base 112 on which is removably mounted a quartz tube 114. The interior of the quartz tube 114 defines a reaction chamber 116 for processing of wafers 3 held by a wafer boat 124 that is supported on the base 112 and contained in the reaction chamber 116. The wafer boat 124 may be a SiC (silicon carbide) wafer boat and typically includes a base plate 125 and a top plate 126 which are spanned by multiple vertical support rods 127.

Figure 1B:
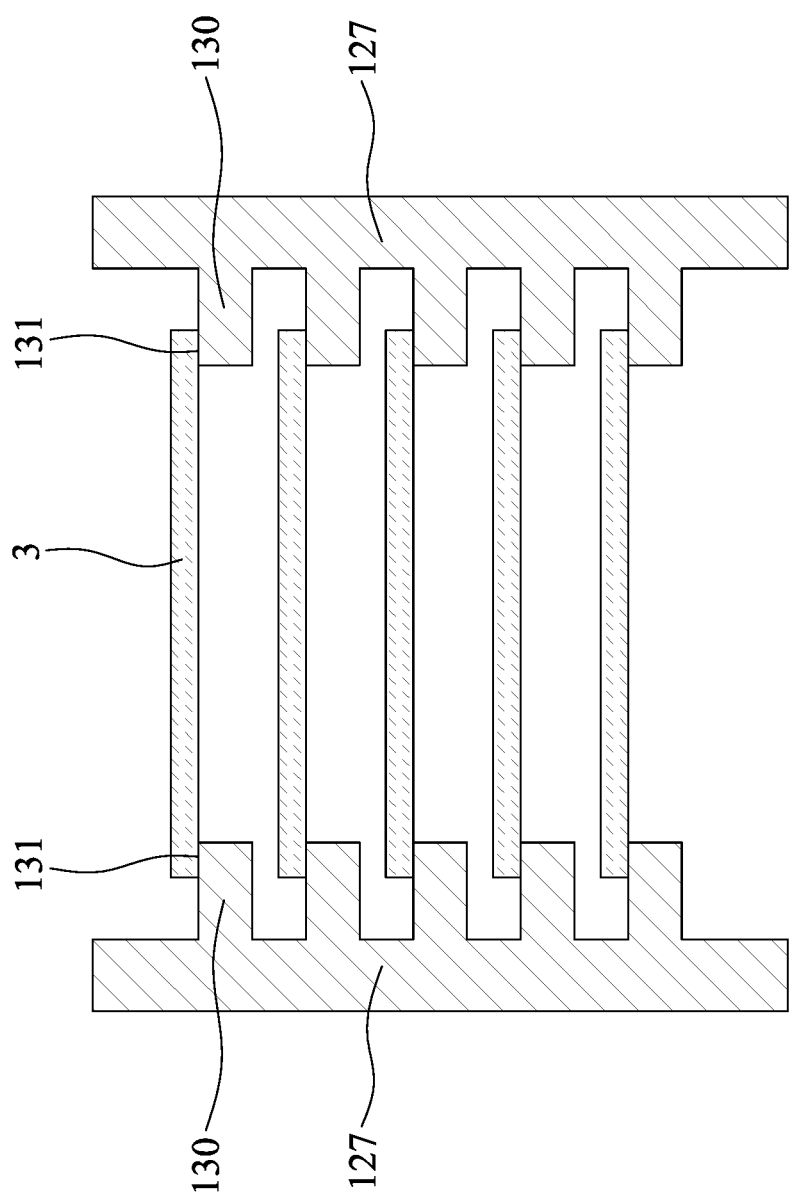
FIG. 1B is a side view of a wafer boat used in conjunction with the furnace of FIG. 1A, illustrating multiple support fingers extending from the support rods and supporting each of multiple wafers during processing of the wafers.
Figure 1C:
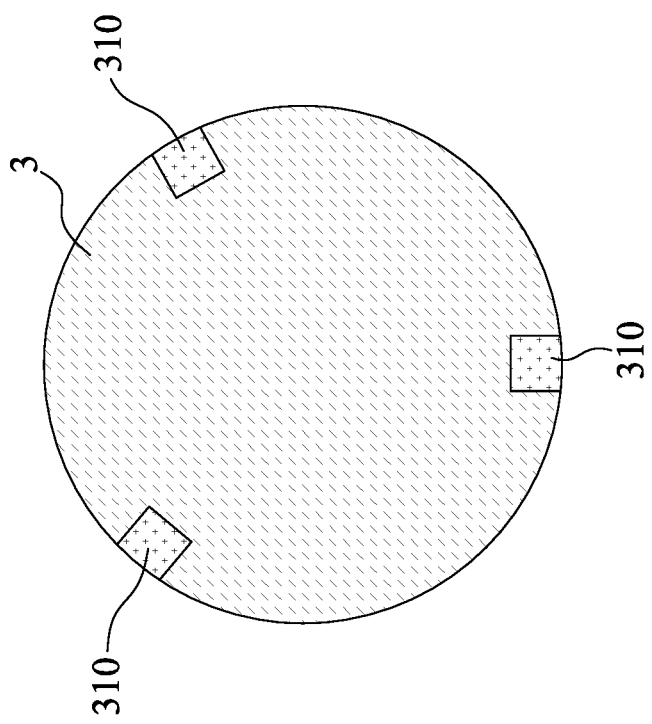
FIG. 1C is a bottom view of a wafer, illustrating multiple chuck marks caused by contacts of the support fingers pf the wafer boat.

As shown in FIG. 1B, multiple vertically-spaced support fingers 130 extend from each of the support rods 127. Each wafer 3 is supported by a set of the support fingers 130 that extend from the respective support rods 127. Accordingly, the support fingers 130 contact the backside of each wafer 3 at multiple contact areas 31 disposed adjacent to the edge of the wafer 3.

A gas inlet tube 118 may extend downwardly through the quartz tube 114 into the reaction chamber 116, and a central gas inlet opening 120 may be provided in the top center of the quartz tube 114, for distributing reaction gases into the reaction chamber 116. A gas outlet 122 is provided typically in the base 112 for distributing exhaust gases from the reaction chamber 116. The gas outlet 122 may be located on the opposite side of the wafer boat 124 with respect to the gas inlet tube 118 to facilitate a more uniform flow of the reaction gases throughout the reaction chamber 116.

During LPCVD processes carried out in the furnace 10, the wafers 3 are processed in batches in order to maintain high wafer throughput. Process gases are introduced into the furnace 10 through the gas inlet tube 118 and/or gas inlet opening 120, and the wafers 3 are heated to facilitate deposition of chemical species from the process gases, onto the wafers 3. Exhaust gases are evacuated from the furnace 10 through the gas outlet 122.

One of the drawbacks associated with the support fingers 130 of the wafer boat 124 is that the backside of the wafer 3 will have chuck marks 310 at the contact areas 31. Since the support fingers 130 contact the backside of the wafer 3 at the contact areas 31, the process gases cannot flow into the contact areas 131 of the backside of the wafer 3. Thus, the film portion formed at the contact area 31 of the backside of the wafer will have a thinner thickness, which causes the film formed on the wafer to have an uneven thickness.

Figure 2A:
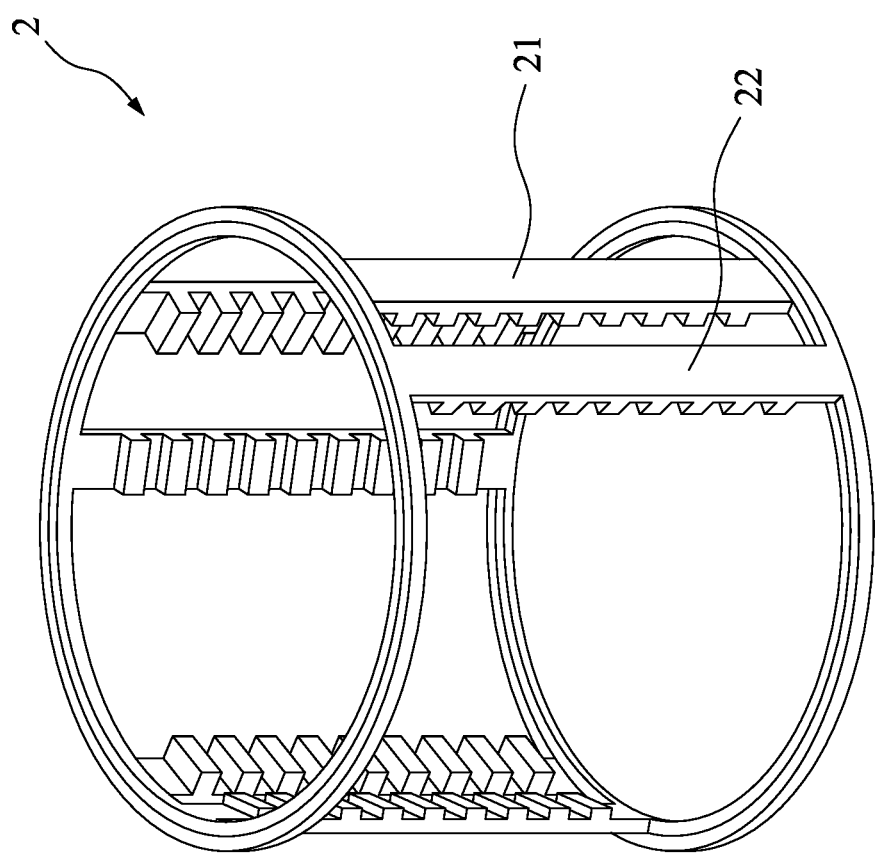
FIG. 2A is a schematic illustration of the wafer holder assembly for holding the wafers, according to some embodiments.
Figure 2B:
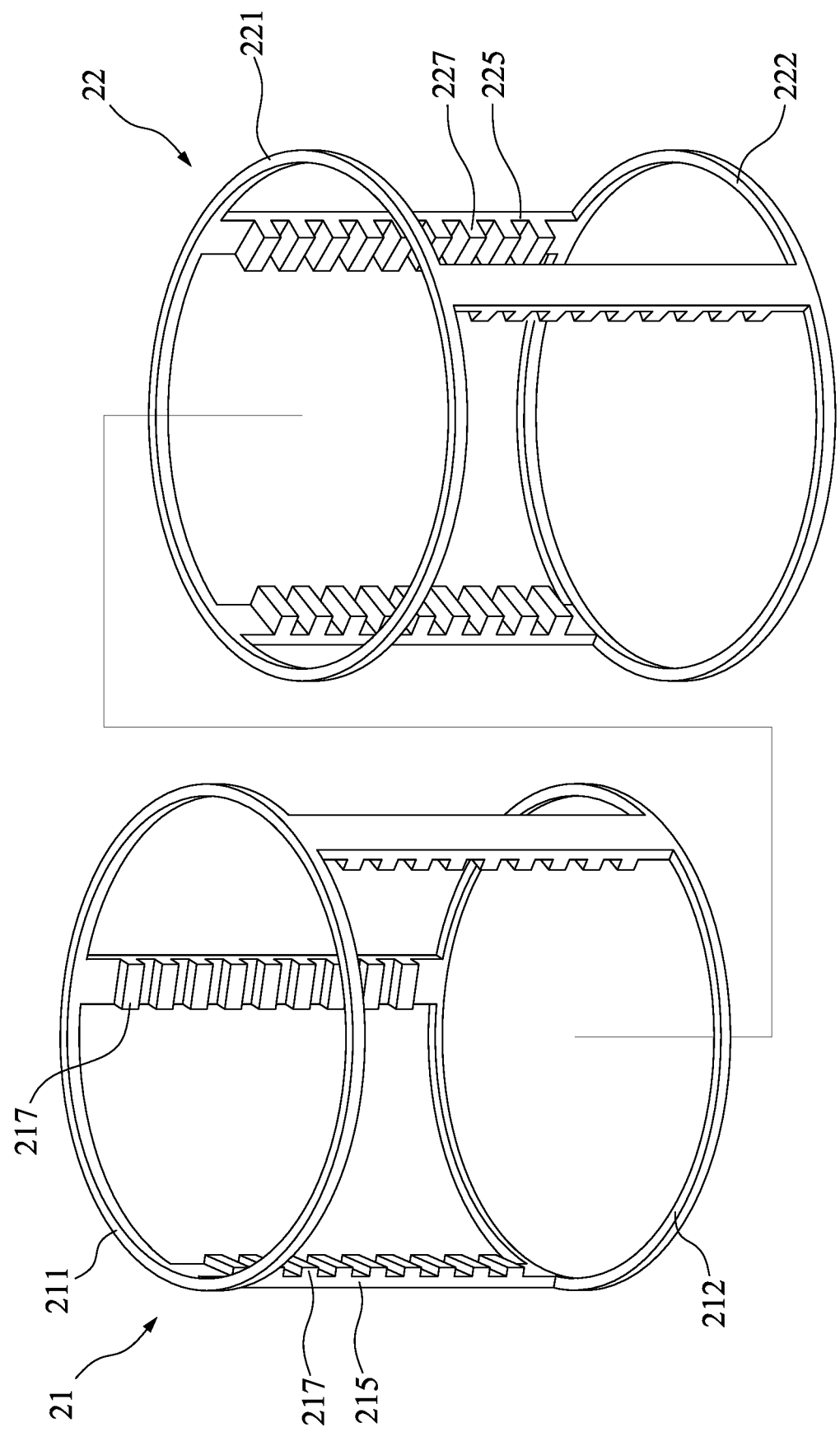
FIG. 2B is an exploded view of the wafer holding assembly, in accordance with some embodiments.
Figure 2C:
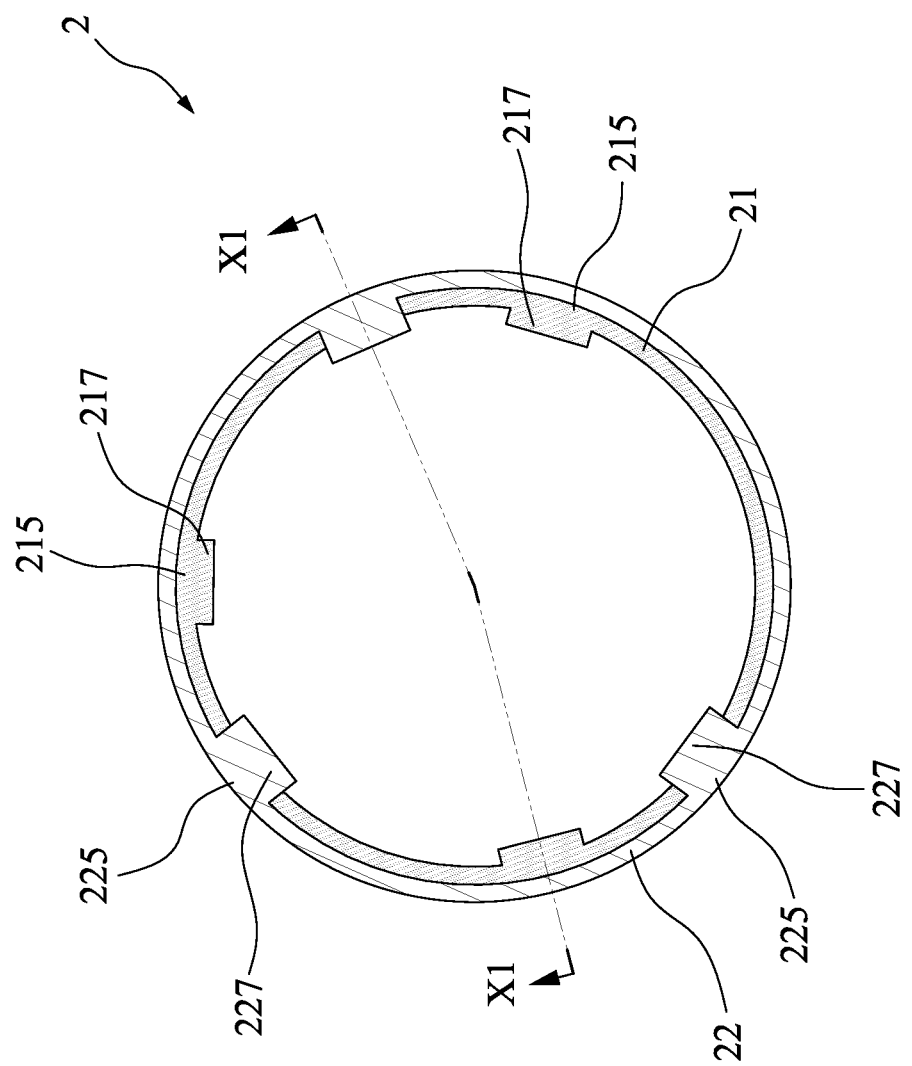
FIG. 2C is a schematic top view of the wafer holding assembly, in accordance with some embodiments.
Figure 2D:
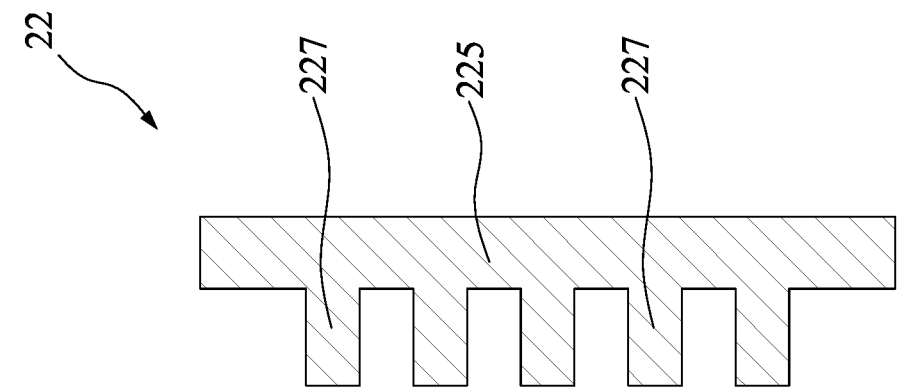
FIG. 2D is a schematic cross-sectional view of the wafer holding assembly, in accordance with some embodiments.
Figure 2D:
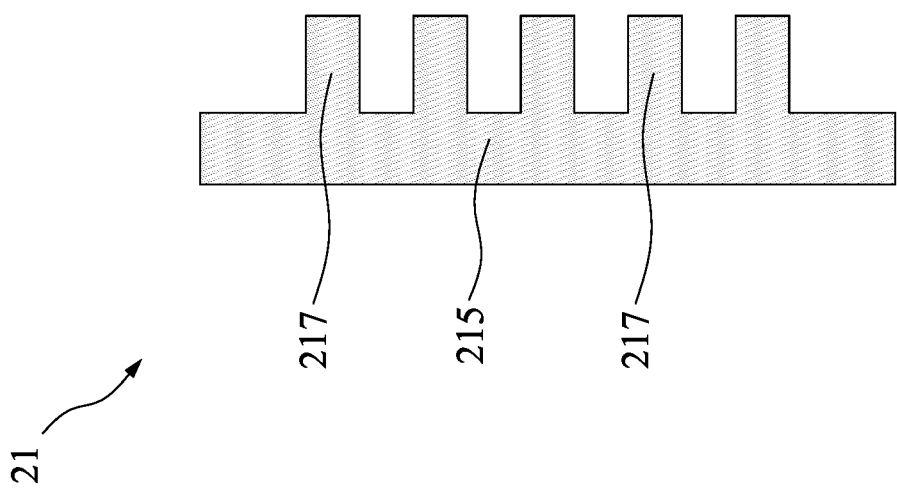

FIG. 2A, FIG. 2B. FIG. 2C and FIG. 2D show a wafer holder assembly 2 in accordance with some embodiments of the present disclosure. In some embodiments of the present disclosure, the wafer holder assembly 2 is configured to support wafers in a processing furnace or chamber. In some embodiments of the present disclosure, the wafer holder assembly 2 may be constructed of quartz, silicon carbide (SiC), silicon (Si) or other corrosion-resistant and heat-resistant materials known by those skilled in the art.

As shown in FIG. 2A and FIG. 2B, the wafer holder assembly 2 may include two wafer holders 21 and 22. The wafer holders 21 and 22 may be joined together to form the wafer holder assembly 2. When the wafer holders 21 and 22 are joined to together, they may move vertically and rotate relative to each other. The wafer holder 21 may include a top plate 211 and a bottom plate 212 which are spanned by multiple vertical support rods 215. The support rods 215 may extend between the top plate 211 and the bottom plate 212, in generally parallel, spaced-apart relationship to each other. In some embodiments of the present disclosure, the wafer holder 21 includes three support rods 215. Further, each of the support rods 215 may include a plurality of support fingers 217. The vertically-spaced support fingers 217 extend from each of the support rods 215, at substantially a 90-degree angle with respect to the longitudinal axis of the support rod 215. The support fingers 217 located at different support rods 215 and in the same common horizontal plane may jointly support and hold a single wafer.

The wafer holder 22 may include a top plate 221 and a bottom plate 222 which are spanned by multiple vertical support rods 225. The support rods 225 may extend between the top plate 221 and the bottom plate 222, in generally parallel, spaced-apart relationship to each other. In some embodiments of the present disclosure, the wafer holder 22 includes three support rods 225. Further, each of the support rods 225 may include a plurality of support fingers 227. The vertically-spaced support fingers 227 extend from each of the support rods 225, at substantially a 90-degree angle with respect to the longitudinal axis of the support rod 225. The support fingers 227 located at different support rods 225 and in the same common horizontal plane may jointly support and hold a single wafer.

FIG. 2C is a top view of the wafer holding assembly 2, in accordance with some embodiments. As shown in FIG. 2C, the support rods 215 may be substantially located at the periphery of the top plate 211 of the wafer holder 21. Thus, when the support fingers 217 of the wafer holder 21 support the wafer, the supports fingers 217 may contact the backside of the wafer at the contact areas adjacent to the edge of the wafer. Further, the support rods 225 may be substantially located at the periphery of the top plate 221 of the wafer holder 22. Thus, when the support fingers 227 of the wafer holder 22 support the wafer, the supports fingers 227 may contact the backside of the wafer at the contact areas adjacent to the edge of the wafer. Referring to FIG. 2C, it can be understood that the contact areas of the support fingers 217 of the wafer holder 21 may be different from the contact areas of the support fingers 227 of the wafer holder 22. As above mentioned, the wafer holders 21 and 22 may be rotated relative to each other. When the wafers holder 21 and 22 are rotated relative to each other around a vertical axis L, the positions of the support fingers 217 and the positions of the support fingers 227 may be changed, and thus a horizontal relationship between the support finger 217 and the support finger 227 may be changed accordingly. That is, the contact areas of the support fingers 217 and the contact areas of the support fingers 227 may be changed, and the relative positional relationship between the contact area of the support finger 217 and the contact area of the support finger 227 may be changed.

FIG. 2D illustrates a schematic cross-sectional view along line X1-X1 in FIG. 2C. Referring to FIG. 2D, the support rod 215 of the wafer holder 21 may include a plurality support fingers 217. The support fingers 217 are vertically arranged at intervals along the support rod 215 and extend inward from the support rod 215. Further, the support rod 225 of the wafer holder 22 may include a plurality support fingers 227. The support fingers 227 are vertically arranged at intervals along the support rod 225 and extend inward from the support rod 225. As above mentioned, the wafer holders 21 and 22 may move relative to each other in a vertical direction. When the wafer holder 21 moves vertically upwards relative to the wafer holder 22 and/or the wafer holder 22 moves vertically downwards relative to the wafer holder 21, the support rod 215 and the support fingers 217 may move vertically upwards relative to the support rod 225 and the support fingers 227 and/or the support rod 225 and the support fingers 227 may move vertically downwards relative to the support rod 215 and the support fingers 217. When the wafer holder 21 moves vertically downwards relative to the wafer holder 22 and/or the wafer holder 22 moves vertically upwards relative to the wafer holder 21, the support rod 215 and the support fingers 217 may move vertically downwards relative to the support rod 225 and the support fingers 227 and/or the support rod 225 and the support fingers 227 may move vertically upwards relative to the support rod 215 and the support fingers 217.

FIG. 3A, FIG. 3B, FIG. 3C, FIG. 3D, FIG. 3E, FIG. 3F and FIG. 3G illustrate a deposition process, in accordance with some embodiments of the present disclosure.

Figure 3A:
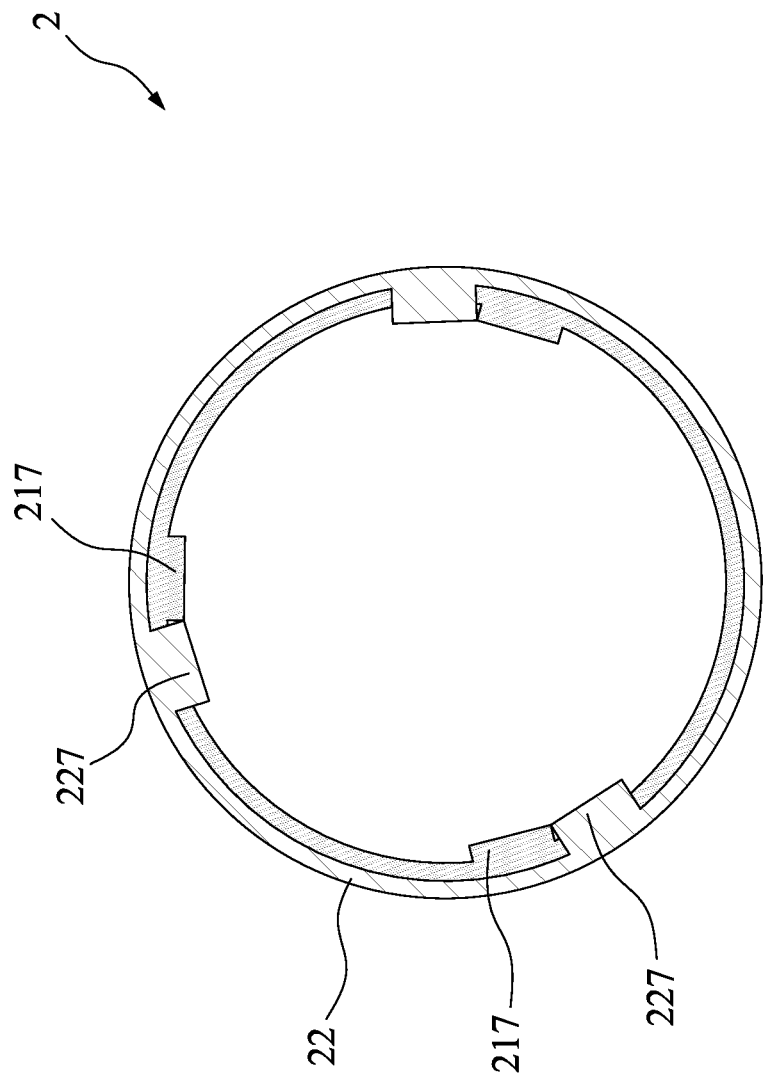
FIG. 3A is a first schematic diagram of the deposition process for the present disclosure, which shows the wafer holding assembly in a bottom view perspective.

FIG. 3A shows the wafer holder assembly 2 in a bottom view perspective. Referring to FIG. 3A, the wafer holder assembly 2 is provided. In some embodiments of the present disclosure, the wafer holder assembly 2 is provided in a vertical furnace. As shown in FIG. 3A, the wafer holders 21 and 22 may be joined together. In some embodiments of the present disclosure, the support fingers 217 of the wafer holder 21 are closely adjacent to the support fingers 227 of the wafer holder 22.

Figure 3B:
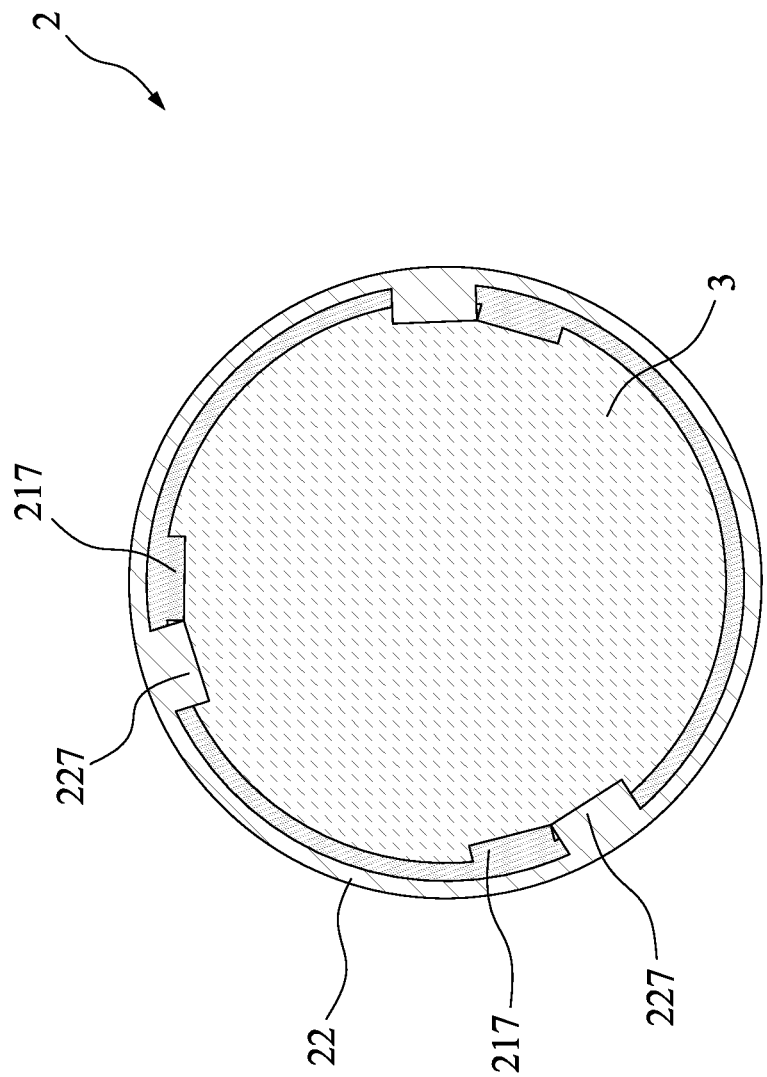
FIG. 3B is a second schematic diagram of the deposition process for the present disclosure, which shows the wafer holding assembly with the wafers in a bottom view perspective.

FIG. 3B shows the wafer assembly 2 and wafers 3 in a bottom view perspective. Referring to FIG. 3B, the wafers 3 are transferred into the wafer holder assembly 2. In some embodiments of the present disclosure, the wafers 3 are supported by the wafer holder 21 and not supported by the wafer holder 22. That is, the support fingers 217 of the wafer holder 21 at the same common horizontal plane contact the backside of the wafer 3 and jointly support the wafer, and the support fingers 227 of the wafer holder 21 are arranged below the backside of the wafer 3 and spaced apart from the backside of the wafer 3.

Figure 3C:
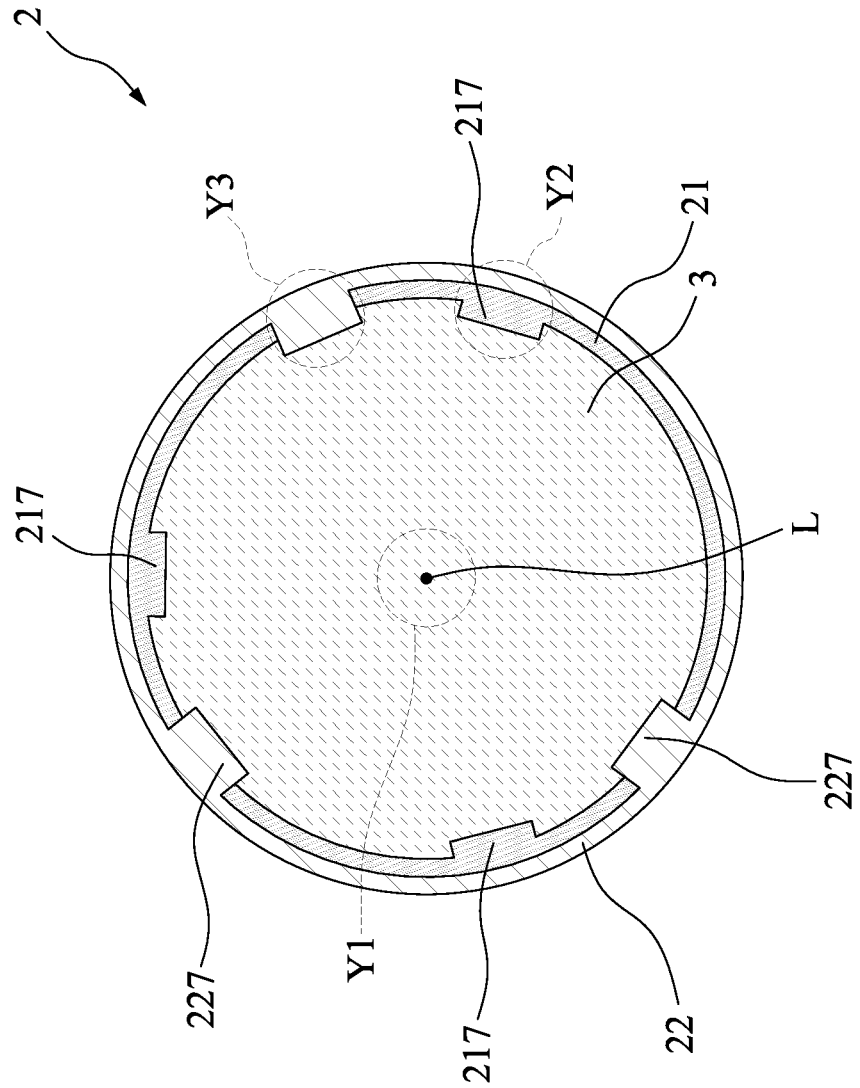
FIG. 3C is a third schematic diagram of the deposition process for the present disclosure, which shows the wafer holding assembly with the wafers in a bottom view perspective.

FIG. 3C shows the wafer assembly 2 and wafers 3 in a bottom view perspective. Referring to FIG. 3C, the wafer holder 2 may be rotated with respect to the wafer holder 1 such that the support fingers 227 of the wafer holder 22 may move away from the support fingers 217 of the wafer holder 21.

Figure 3D:
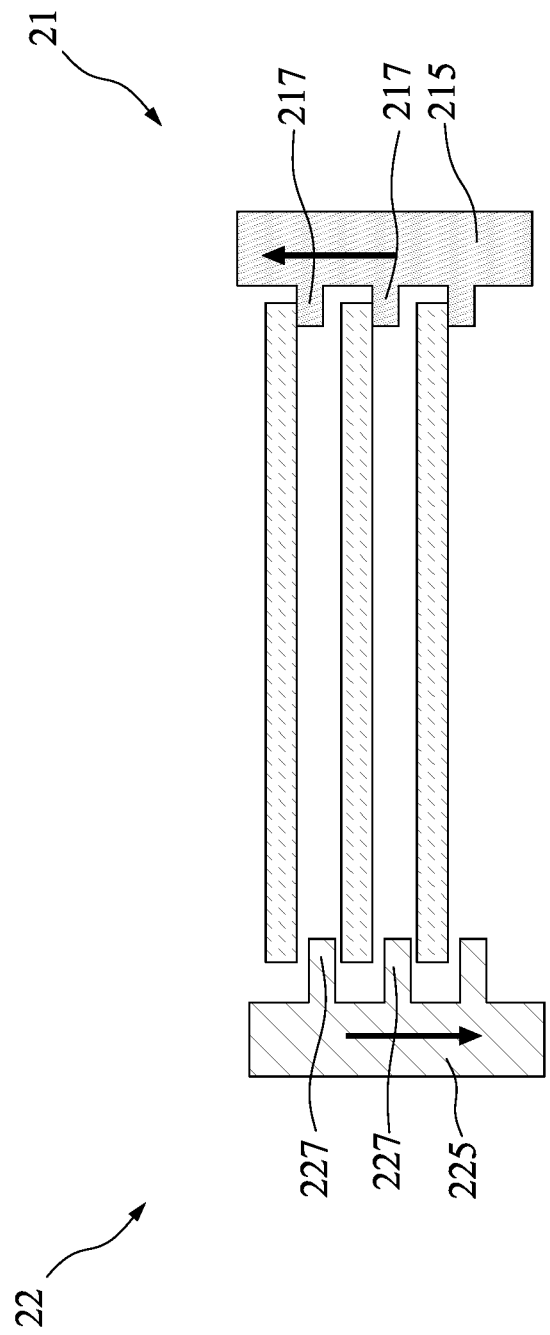
FIG. 3D is a fourth schematic diagram of the deposition process for the present disclosure, which shows the wafer holding assembly with the wafers in a cross-sectional view perspective.

FIG. 3D shows the wafer assembly 2 and wafers in a cross-sectional view. Referring to FIG. 3D, the support finger 217 of the wafer holder 21 contacts the backside of the wafer 3 and support the backside of the wafer 3 and the support finger 227 of the wafer holder 22 is spaced apart from the backside of the wafer 3 and does not support the backside of the wafer 3. If the support finger 217 of the wafer holder 21 is not in contact with the backside of the wafer 3 and/or the support finger 227 of the wafer holder 22 is not fully separated from the backside of the wafer 3, the wafer holder 21 may be moved vertically upward and/or the wafer holder 22 may be moved vertically downward to ensure that the support finger 217 of the wafer holder 21 contacts and supports the backside of the wafer 3 and the support finger 227 of the wafer holder 22 is fully separated from the backside of the wafer 3.

After moving the wafer holder 21 and/or the wafer holder 22 such that the support fingers 217 of the wafer holder 21 support the backsides of the wafers 3 and the supports fingers 227 of the wafer holders 22 are not in contact with the backsides of the wafers 3, the process gas may be supplied to perform the first stage of the deposition process on the wafers 3.

Figure 3E:
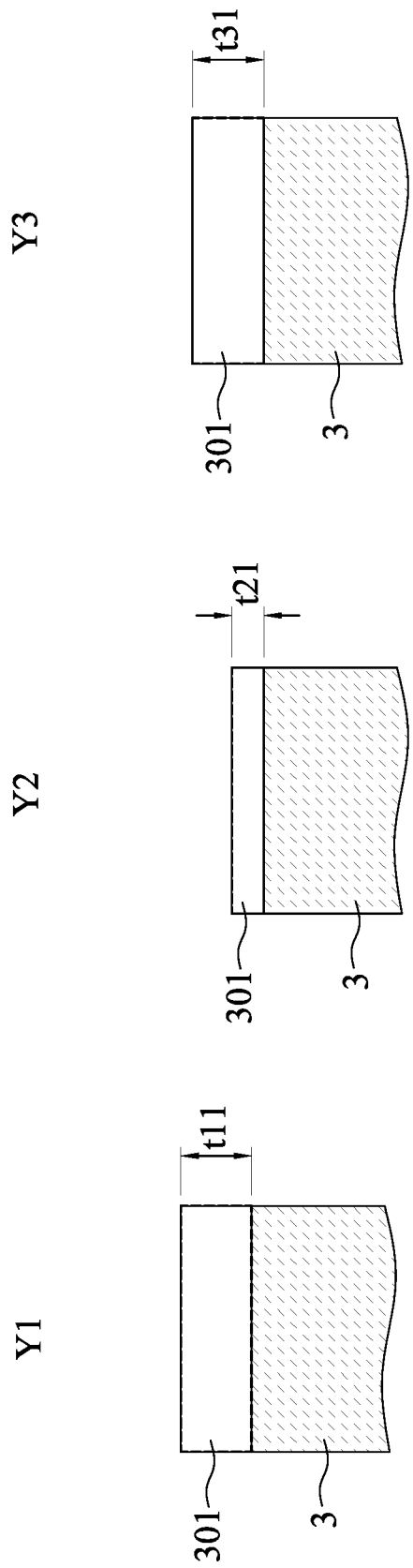
FIG. 3E is a fifth schematic diagram of the deposition process for the present disclosure, which shows the film formation in the regions on the backside of the wafer.

FIG. 3E shows the film formation in the regions Y1, Y2, Y3 on the backside of the wafer 3 as shown in FIG. 3C after the first stage of the deposition process. Referring to FIG. 3C, Y1 region may be adjacent to the central of the backside of the wafer 3, and Y2 region may be adjacent to the contact area on the backside of the wafer that may be in contact with the support finger 217 of the wafer holder 21, and Y3 region may be adjacent to the contact area on the backside of the wafer that may be in contact with the support finger 227 of the wafer holder 22. As shown in FIG. 3E, the thickness t11 of the film portion 301 formed in Y1 region may be approximately 35.09 nanometers, and the thickness t21 of the film portion 301 formed in Y2 region may be approximately 15.07 nanometers and the thickness t31 of the film portion 301 formed in Y3 region may be approximately 25.29 nanometers.

Figure 3F:
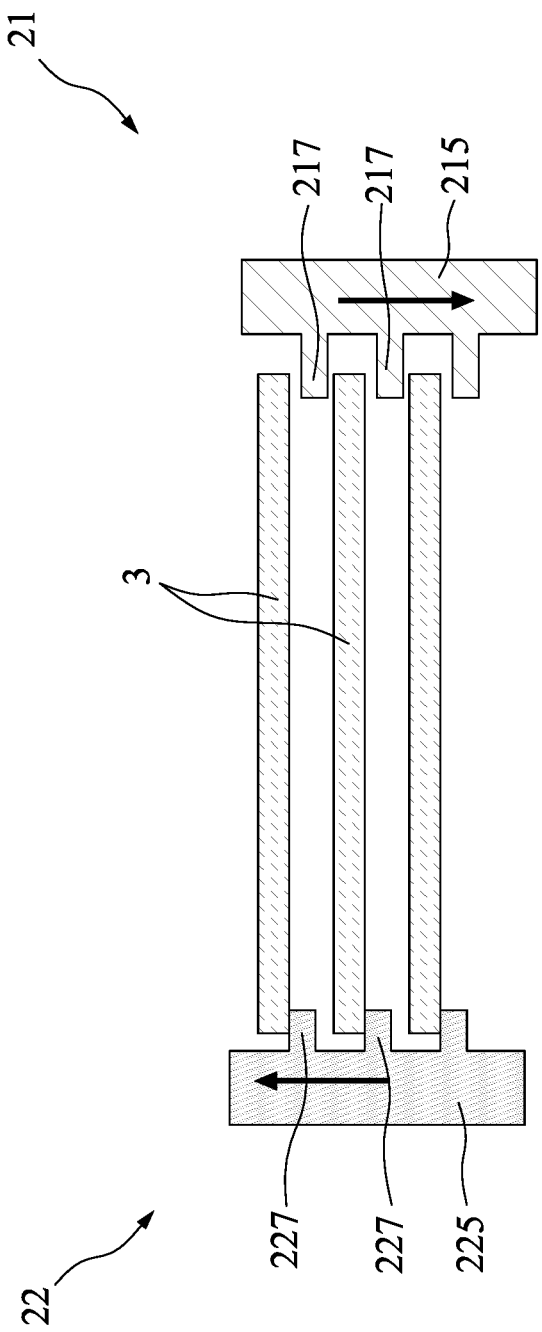
FIG. 3F is a sixth schematic diagram of the deposition process for the present disclosure, which shows the wafer holding assembly with the wafers in a cross-sectional view perspective.

FIG. 3F shows the wafer assembly 2 and wafers in a cross-sectional view. After the implementation of the first stage of the deposition process, the wafer holder 21 may be moved vertically doward and/or the wafer holder 22 may be moved vertically upward to make that the support finger 227 of the wafer holder 22 contacts and supports the backside of the wafer 3 and the support finger 217 of the wafer holder 21 is fully separated from the backside of the wafer 3. In some embodiments of the present disclosure, when performing vertical relative movement of the wafer holders 21 and 22, the wafer holders 21 and 22 may be simultaneously rotated relative to each other.

After moving the wafer holder 21 and/or the wafer holder 22 such that the support fingers 227 of the wafer holder 22 support the backsides of the wafers 3 and the supports fingers 217 of the wafer holders 21 are not in contact with the backsides of the wafers 3, the second stage of the deposition process may be performed on the wafers 3. In some embodiments of the present disclosure, the first stage of the deposition process and the second stage of the deposition are continuous.

Figure 3G:
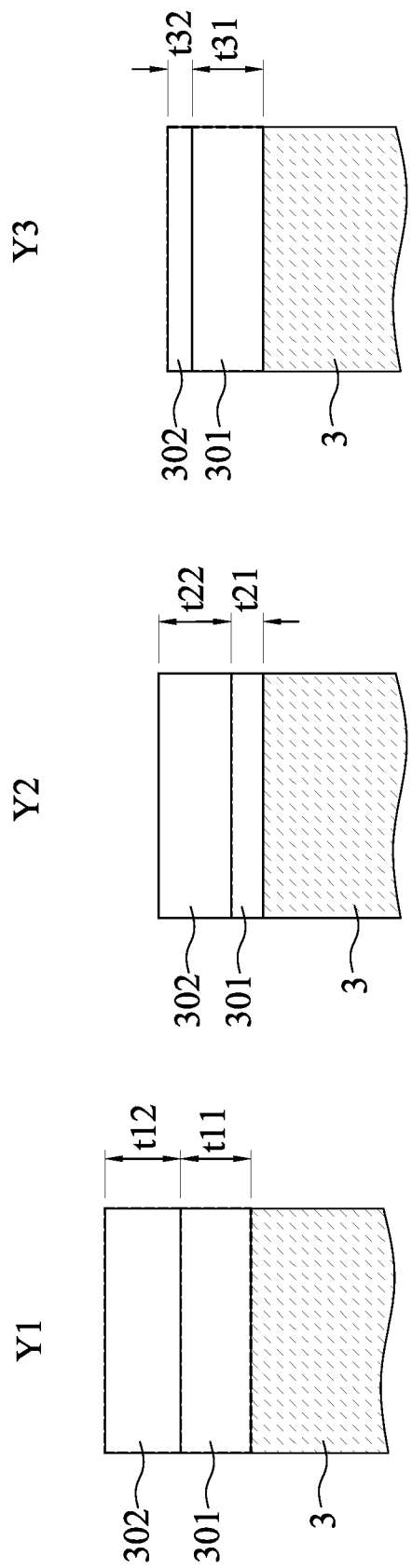
FIG. 3G is a seventh schematic diagram of the deposition process for the present disclosure, which shows the film formation in the regions on the backside of the wafer.

FIG. 3G shows the film formation in the regions Y1, Y2, Y3 on the backside of the wafer 3 as shown in FIG. 3C after the second stage of the deposition process. As shown in FIG. 3G, the thickness t12 of the film portion 302 formed in Y1 region may be approximately 37.43 nanometers, and the thickness t22 of the film portion 302 formed in Y2 region may be approximately 36.76 nanometers and the thickness t32 of the film portion 301 formed in Y3 region may be approximately 7.72 nanometers. Thus, the total thickness t11 and t12 of the film portions 301 and 302 in Y1 region may be 72.52 nanometers, and the total thickness t21 and t22 of the film portions 301 and 302 in Y2 region may be 51.83 nanometers, and the total thickness t31 and t32 of the film portions 301 and 302 in Y3 region may be 43.01 nanometers. That is, the uniformity of the thickness of the film formed on the backside of the wafer may be improved.

Figure 4:
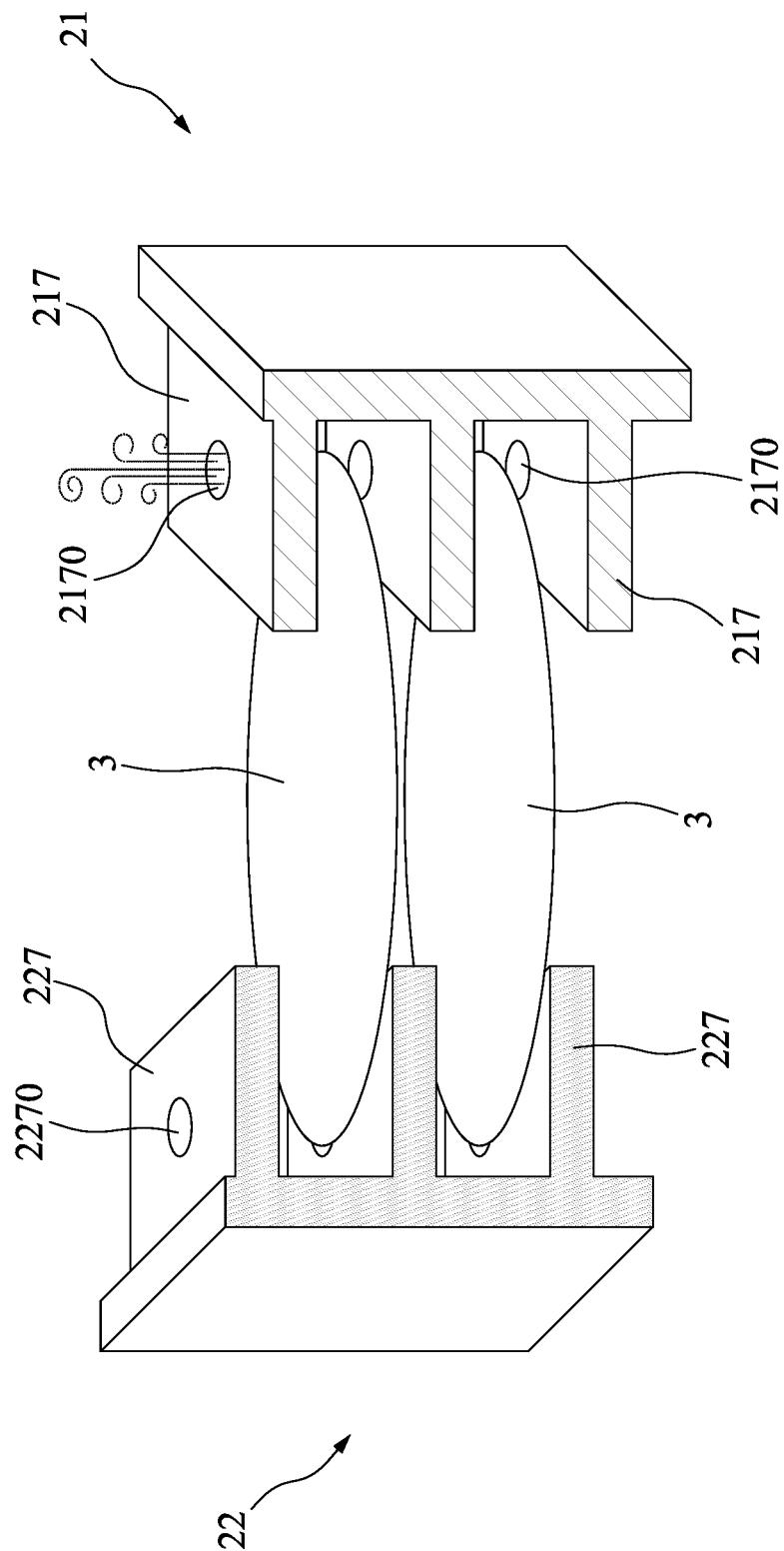
FIG. 4 is a schematic cross-sectional view of the wafer holding assembly, in accordance with some embodiments.

FIG. 4 is a schematic cross-sectional view of the wafer holding assembly 3, in accordance with some embodiments. As shown in FIG. 4, in some embodiments of the present disclosure, the wafer holder 21 includes a plurality of gas orifices 2170, and the wafer holder 22 includes a plurality of gas orifices 2270. The gas orifice 2170 may be arranged at the support finger 217 of the wafer holder 21 and face the backside of the wafer 3. The gas orifice 2270 may be arranged at the support fingers 227 of the wafer holder 22 and face the backside of the wafer 3. In some embodiments of the present disclosure, the gas orifice 2170, 2270 is configured to provide an additional process gas. When the support fingers 217 contacts and supports the backside of the wafer 3 and the support fingers 227 are spaced apart from the backside of the backside of the wafer 3, the gas orifice 2270 may provide the additional process gas to the backside of the wafer 3. Since the gas orifice 2270 may face the contact area of the backside of the wafer 3 that may be in contact with the support fingers 227 in the previous stage of the deposition process, the additional gas from the gas orifice 2270 may enhance the film deposition in that area to compensate for the film deposition. When the support fingers 227 contacts and supports the backside of the wafer 3 and the support fingers 217 are spaced apart from the backside of the backside of the wafer 3, the gas orifice 2170 may provide the additional process gas to the backside of the wafer 3. Since the gas orifice 2170 may face the contact area of the backside of the wafer 3 that may be in contact with the support fingers 217 in the previous stage of the deposition process, the additional gas from the gas orifice 2170 may enhance the film deposition in that area to compensate for the film deposition. In some embodiments of the present disclosure, when the support finger 217 of the wafer holder 21 contacts and supports the backside of the wafer 3, the wafer 3 may cover the gas orifice 2170. In some embodiments of the present disclosure, when the support finger 227 of the wafer holder 22 contacts and supports the backside of the wafer 3, the wafer 3 may cover the gas orifice 2270.

Figure 5:
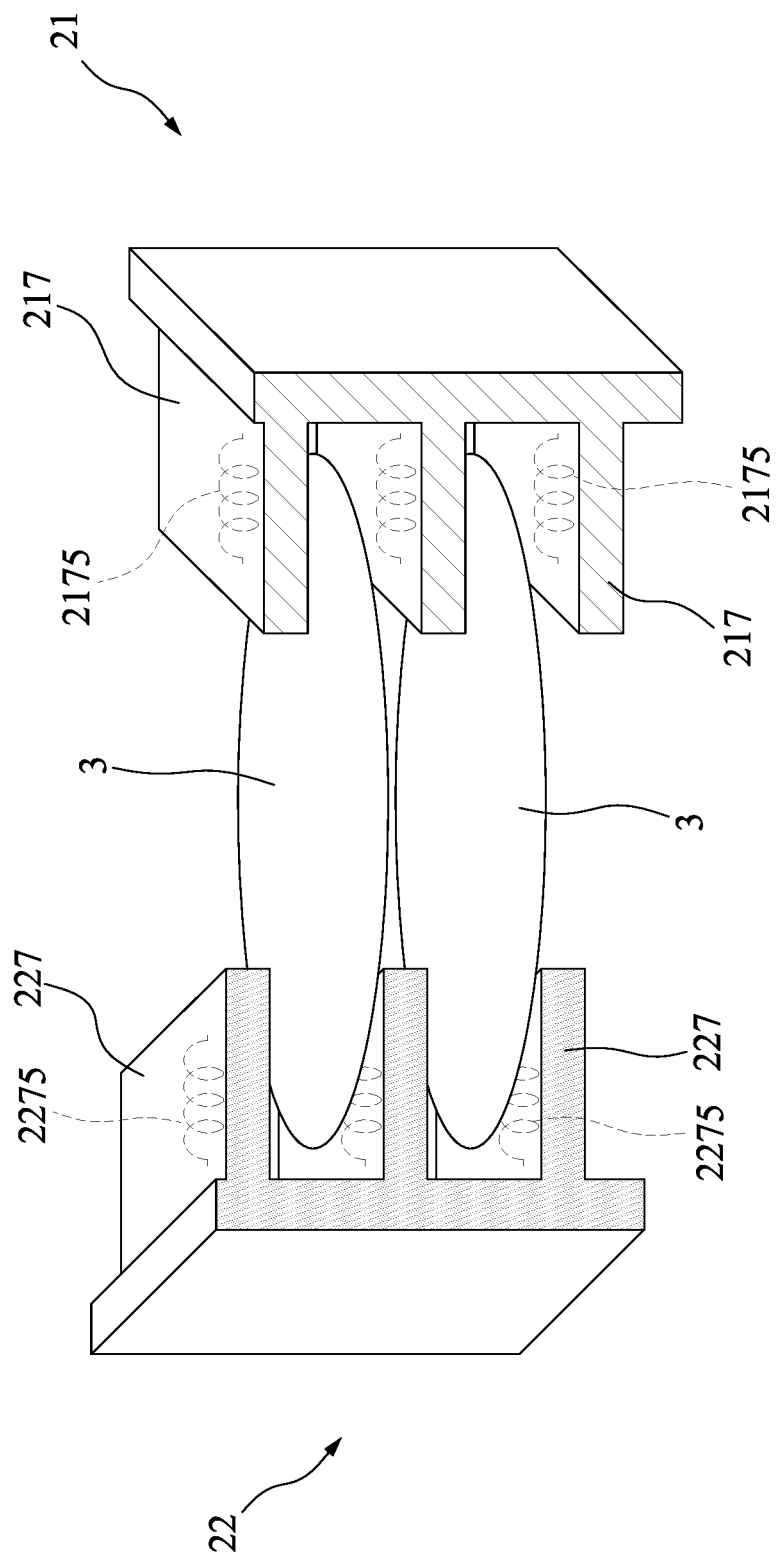
FIG. 5 is a schematic cross-sectional view of the wafer holding assembly, in accordance with some embodiments.

FIG. 5 is a schematic cross-sectional view of the wafer holding assembly 3, in accordance with some embodiments. As shown in FIG. 5, in some embodiments of the present disclosure, the wafer holder 21 includes a plurality of heating elements 2175, and the wafer holder 22 includes a plurality of heating elements 2275. The heating element 2175 may be arranged at the support finger 217 of the wafer holder 21. The heating element 2275 may be arranged at the support fingers 227 of the wafer holder 22. The heating element 2175, 2275 is configured to be driven to generate heat at the support finger 217, 227. When the support fingers 217 contacts and supports the backside of the wafer 3 and the support fingers 227 are spaced apart from the backside of the backside of the wafer 3, the heating element 2275 may be driven to generate heat at the support finger 227. That is, the heating element 2275 may be activated to heat the contact area of the backside of the wafer 3 wherein the support finger 217 may be in contact during the previous stage of the deposition process. This may improve the film deposition in that area to compensate for the film deposition. When the support fingers 227 contacts and supports the backside of the wafer 3 and the support fingers 217 are spaced apart from the backside of the backside of the wafer 3, the heating element 2175 may be driven to generate heat at the support finger 217. That is, the heating element 2175 may be activated to heat the contact area of the backside of the wafer 3 wherein the support finger 227 may be in contact during the previous stage of the deposition process. This may improve the film deposition in that area to compensate for the film deposition.

Figure 6:
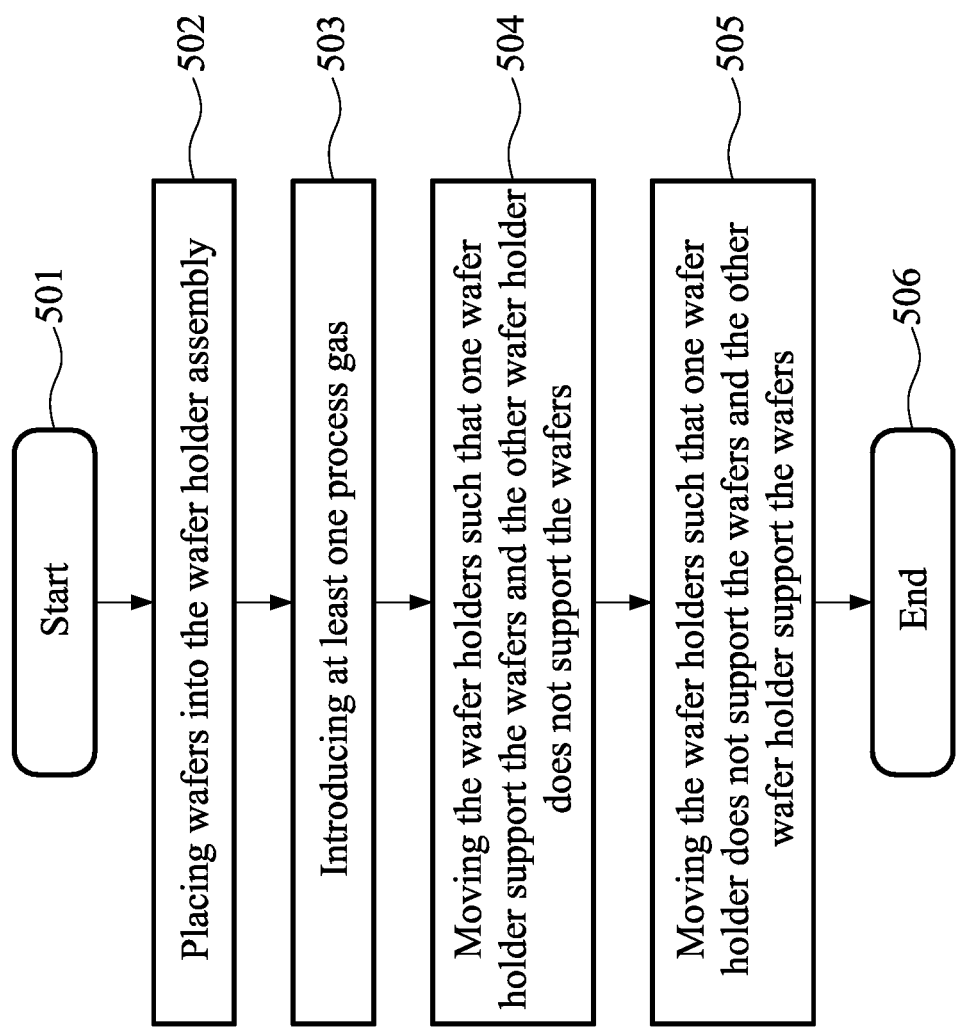
FIG. 6 is a flow chart representing exemplary operations of the method for operating the wafer holder assembly during the deposition process, in accordance with some embodiments of the present disclosure.

FIG. 6 is a flow chart representing exemplary operations of the method for operating the wafer holder assembly during the deposition process, in accordance with some embodiments of the present disclosure.

In step 501, a deposition process begins.

In step 502, the wafers 3 may be transferred in to the wafer holder assembly 2. In some embodiments of the present disclosure, the wafer holder assembly 2 may be arranged in a process furnace.

In step 503, at least one process gas may be introduced to the wafer holder assembly 2.

In step 504, the wafer holder 21 may move vertically upwards relative to the wafer holder 22 and/or the wafer holder 22 may move vertically downwards relative to the wafer holder 21 so that the support fingers 217 of the wafer holder 21 may contact and support the backsides of the wafers 3 and the support fingers 227 of the wafer holder 22 may be spaced apart from the backsides of the wafers 3. In some embodiments of the present disclosure, the process gas introduction in step 503 may be performed after step 504.

In step 505, after a period of time, the wafer holder 21 may move vertically downwards relative to the wafer holder 22 and/or the wafer holder 22 may move vertically upwards relative to the wafer holder 21 so that the support fingers 217 of the wafer holder 21 may be spaced apart from the backsides of the wafers 3 and the support fingers 227 of the wafer holder 22 may contact and support the backsides of the wafers 3. In some embodiments of the present disclosure, when performing vertical relative movement of the wafer holders 21 and 22, the wafer holders 21 and 22 may be simultaneously rotated relative to each other.

In step 506, after a certain period of time, the deposition process may be terminated. In some embodiments of the present disclosure, before proceeding to step 506, steps 504 to 505 may be repeated multiple times. The repetition of steps 504 to 505 can be performed multiple times to achieve the desired deposition film thickness and quality. Only after achieving the desired film thickness and quality can step 506 be entered.

Figure 7:
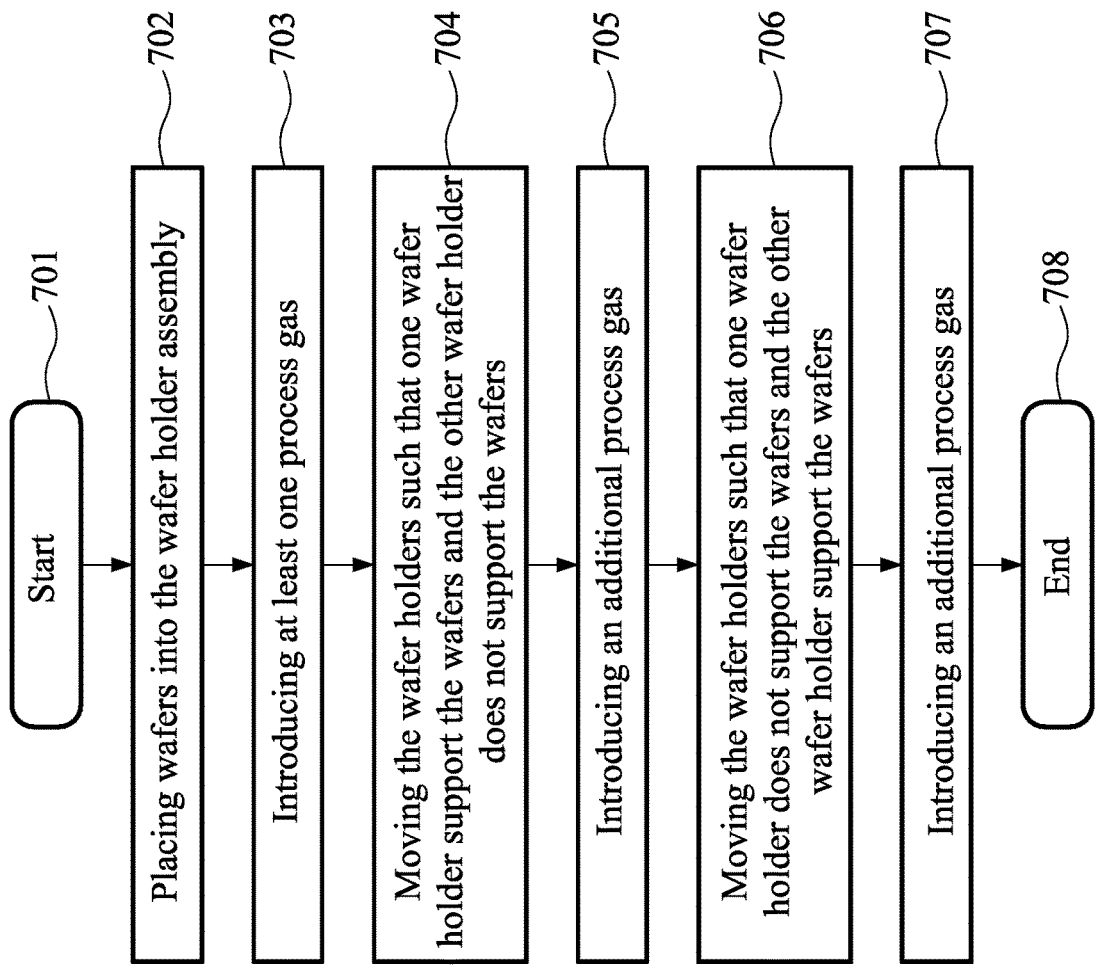
FIG. 7 is a flow chart representing exemplary operations of the method for operating the wafer holder assembly during the deposition process, in accordance with some embodiments of the present disclosure.

FIG. 7 is a flow chart representing exemplary operations of the method for operating the wafer holder assembly during the deposition process, in accordance with some embodiments of the present disclosure.

In step 701, a deposition process begins.

In step 702, the wafers 3 may be transferred in to the wafer holder assembly 2. In some embodiments of the present disclosure, the wafer holder assembly 2 may be arranged in a process furnace.

In step 703, at least one process gas may be introduced to the wafer holder assembly 2.

In step 704, the wafer holder 21 may move vertically upwards relative to the wafer holder 22 and/or the wafer holder 22 may move vertically downwards relative to the wafer holder 21 so that the support fingers 217 of the wafer holder 21 may contact and support the backsides of the wafers 3 and the support fingers 227 of the wafer holder 22 may be spaced apart from the backsides of the wafers 3. In some embodiments of the present disclosure, the process gas introduction in step 703 may be performed after step 704.

In step 705, the gas orifices 2270 at the support fingers 227 of the wafer 22 may supply the additional process to the backside of the wafer 3. In some embodiments of the present disclosure, the additional process is supplied to the contact area of the support finger 227 on the backside of the wafer 3.

In step 706, after a period of time, the wafer holder 21 may move vertically downwards relative to the wafer holder 22 and/or the wafer holder 22 may move vertically upwards relative to the wafer holder 21 so that the support fingers 217 of the wafer holder 21 may be spaced apart from the backsides of the wafers 3 and the support fingers 227 of the wafer holder 22 may contact and support the backsides of the wafers 3. In some embodiments of the present disclosure, when performing vertical relative movement of the wafer holders 21 and 22, the wafer holders 21 and 22 may be simultaneously rotated relative to each other.

In step 707, the gas orifices 2170 at the support fingers 217 of the wafer 21 may supply the additional process to the backside of the wafer 3. In some embodiments of the present disclosure, the additional process is supplied to the contact area of the support finger 217 on the backside of the wafer 3.

In step 708, after a certain period of time, the deposition process may be terminated. In some embodiments of the present disclosure, before proceeding to step 708, steps 704 to 707 may be repeated multiple times. The repetition of steps 704 to 707 can be performed multiple times to achieve the desired deposition film thickness and quality. Only after achieving the desired film thickness and quality can step 708 be entered.

Figure 8:
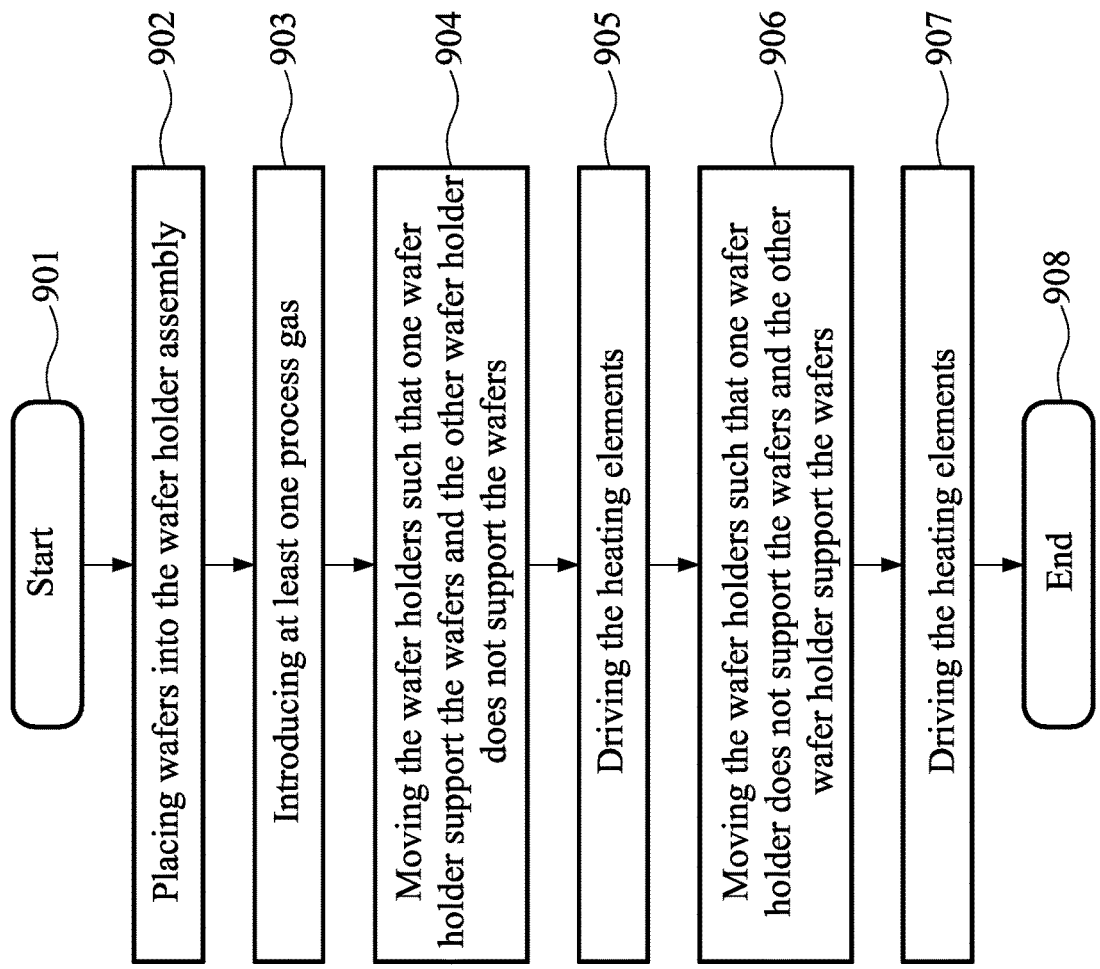
FIG. 8 is a flow chart representing exemplary operations of the method for operating the wafer holder assembly during the deposition process, in accordance with some embodiments of the present disclosure.

FIG. 8 is a flow chart representing exemplary operations of the method for operating the wafer holder assembly during the deposition process, in accordance with some embodiments of the present disclosure.

In step 901, a deposition process begins.

In step 902, the wafers 3 may be transferred in to the wafer holder assembly 2. In some embodiments of the present disclosure, the wafer holder assembly 2 may be arranged in a process furnace.

In step 903, at least one process gas may be introduced to the wafer holder assembly 2.

In step 904, the wafer holder 21 may move vertically upwards relative to the wafer holder 22 and/or the wafer holder 22 may move vertically downwards relative to the wafer holder 21 so that the support fingers 217 of the wafer holder 21 may contact and support the backsides of the wafers 3 and the support fingers 227 of the wafer holder 22 may be spaced apart from the backsides of the wafers 3. In some embodiments of the present disclosure, the process gas introduction in step 903 may be performed after step 904.

In step 905, the heating elements 2275 at the support fingers 227 of the wafer holder 22 may be driven to generate heat. In some embodiments of the present disclosure, the heat generated by the heating elements 2275 may be applied to the contact area of the support finger 227 on the backside of the wafer 3.

In step 906, after a period of time, the wafer holder 21 may move vertically downwards relative to the wafer holder 22 and/or the wafer holder 22 may move vertically upwards relative to the wafer holder 21 so that the support fingers 217 of the wafer holder 21 may be spaced apart from the backsides of the wafers 3 and the support fingers 227 of the wafer holder 22 may contact and support the backsides of the wafers 3. In some embodiments of the present disclosure, when performing vertical relative movement of the wafer holders 21 and 22, the wafer holders 21 and 22 may be simultaneously rotated relative to each other.

In step 907, the heating elements 2175 at the support fingers 217 of the wafer holder 21 may be driven to generate heat. In some embodiments of the present disclosure, the heat generated by the heating elements 2175 may be applied to the contact area of the support finger 217 on the backside of the wafer 3.

In step 908, after a certain period of time, the deposition process may be terminated. In some embodiments of the present disclosure, before proceeding to step 908, steps 904 to 907 may be repeated multiple times. The repetition of steps 904 to 907 can be performed multiple times to achieve the desired deposition film thickness and quality. Only after achieving the desired film thickness and quality can step 908 be entered.

It will be appreciated that in the forgoing apparatus and method, the uniformity of the thickness of the film formed on the backside of the wafer may be improved.

According to one embodiment of the present disclosure, a wafer holder assembly includes a first wafer holder with a plurality of first fingers arranged in a first common horizontal plane and a second wafer holder with a plurality of second fingers arranged in a second common horizontal plane. The first wafer holder and the second holder are configured to move relative to each other in a vertical direction, and the first wafer holder and the second holder are configured to rotate relative to each other around a vertical axis.

According to another embodiment, a wafer holder assembly includes a first wafer holder and a second wafer holder cooperating with the first wafer holder. The first wafer holder and the second wafer holder are configured to support a backside of a wafer alternately.

According to one embodiment of the present disclosure, a method for forming a film, the method includes: placing a wafer into a wafer holder assembly, wherein the wafer holder assembly comprises a first wafer holder and a second wafer holder; introducing at least one process gas; moving the first wafer holder and/or the second wafer holder so that the first wafer holder supports a backside of the wafer and the second wafer holder is free of supporting the backside of the wafer; and moving the first wafer holder and/or the second wafer holder so that the second wafer holder supports a backside of the wafer and the first wafer holder is free of supporting the backside of the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer holder assembly, comprising:
a first wafer holder having a first upper ring, a first lower ring and a plurality of first support rods vertically extending from the first upper ring to the first lower ring, wherein each of the first support rods comprises at least one first finger; and
a second wafer holder having a second upper ring, a second lower ring and a plurality of second support rods vertically extending from the second upper ring to the second lower ring, wherein each of the second support rods comprises at least one second finger;

wherein an outer surface of each of the first support rods is substantially aligned with respective outer peripheries of the first upper ring and the first lower ring;

wherein an outer surface of each of the second support rods is substantially aligned with respective outer peripheries of the second upper ring and the second lower ring;

wherein, when the first wafer holder and the second wafer holder are joined together, the first upper ring surrounds the second upper ring and the first lower ring surrounds the second lower ring.

2. The wafer holder assembly of claim 1, wherein the at least one first finger on each of the first support rods is positioned at a first common horizontal plane and the at least one second finger on each of the second support rods is positioned at a second common horizontal plane, and wherein a vertical positional relationship between the first common horizontal plane and the second common horizontal plane is configured to be changed by vertical movement of the first wafer holder and/or the second wafer holder.

3. The wafer holder assembly of claim 1, wherein a spacing in a horizontal direction between the at least one first finger on each of the first support rods and the at least one second finger on each of the second support rods is configured to be varied by rotation of the first wafer holder relative to the second wafer holder.

4. The wafer holder assembly of claim 1, wherein a radial thickness of the first support rod is equal to a radial width of the first upper ring or a radial width of the first lower ring, and wherein a radial thickness of the second support rod is equal to a radial width of the second upper ring or a radial width of the second lower ring.

5. The wafer holder assembly of claim 4, wherein the at least one first finger on each of the first support rods and the at least one second finger on each of the second support rod are configured to extend toward the vertical axis.

6. The wafer holder assembly of claim 2, wherein, when a level of the first common horizontal plane is higher than a level of the second common horizontal plane by vertically moving the first wafer holder relative to the second wafer holder, the first fingers are configured to jointly support and hold a single wafer, and wherein, when the level of the second common horizontal plane is higher than the level of the first common horizontal plane by vertically moving the second wafer holder relative to the first wafer holder, the second fingers are configured to jointly support and hold the single wafer.

7. The wafer holder assembly of claim 6, wherein, when the first fingers jointly support and hold the single wafer, the first fingers are configured to contact a plurality of first areas on a backside of the single wafer; and when the second fingers jointly support and hold the single wafer, the plurality of second fingers are configured to contact a plurality of second areas on the backside of the single wafer, the plurality of first areas being located differently from the plurality of second areas.

8. The wafer holder assembly of claim 7, wherein the plurality of first areas and the plurality of second areas are adjacent to a periphery of the single wafer.

9. The wafer holder assembly of claim 1, wherein, when the first wafer holder and the second wafer holder are jointed together, in a top view perspective, none of the second support rods overlaps the first upper ring or the first lower ring.

10. The wafer holder assembly of claim 4, wherein a horizontal distance between the vertical axis and each of the first support rods is greater than a horizontal distance between the vertical axis and each of the second support rods.

11. A wafer holder assembly, comprising:
a first wafer holder having a first upper plate, a lower first plate and a plurality of first rods between the first upper plate and the first lower plate; and
a second wafer holder having a second upper plate, a lower second plate and a plurality of second rods between the second upper plate and the second lower plate;
wherein the first wafer holder and the second wafer holder are jointly configured to support a backside of a wafer alternately based on a change in a relative vertical position therebetween;
wherein an outer surface of each of the first rods is radially flush with both the outer periphery of the first upper plate and the outer periphery of the first lower plate; and wherein an outer surface of each of the second rods is radially flush with both the outer periphery of the second upper plate and the outer periphery of the second lower plate.

12. The wafer holder assembly of claim 11, wherein the first wafer holder and the second wafer holder are configured such that, through relative movement therebetween in a vertical direction, either (i) the first wafer holder supports the backside of the wafer and the second wafer holder does not support the backside of the wafer, or (ii) the second wafer holder supports the backside of the wafer and the first wafer holder does not support the backside of the wafer.

13. The wafer holder assembly of claim 11, wherein the backside of the wafer comprises first areas in contact with the first wafer holder when the first wafer holder supports the backside of the wafer, and wherein the backside of the wafer comprises second areas in contact with the second wafer holder when the second wafer holder supports the backside of the wafer, and wherein the first areas of the backside of the wafer are different from the second areas of the backside of the wafer.

14. The wafer holder assembly of claim 13, wherein a relative positional relationship in a horizontal direction between the first area and the second area of the backside of the wafer is changed by rotating the first wafer holder relative to the second wafer holder and/or rotating the second wafer holder relative to the first wafer holder.

15. The wafer holder assembly of claim 12, wherein, when the first wafer holder supports the backside of the wafer and the second wafer holder does not support the backside of the wafer, first fingers on the first rods are in contact with the backside of the wafer and second fingers on the second rods are spaced apart from the backside of the wafer, and wherein, when the second wafer holder supports the backside of the wafer and the first wafer holder does not support the backside of the wafer, the second fingers on the second rods holder are in contact with the backside of the wafer and the first fingers on the first rods are spaced apart from the backside of the wafer.

16. The wafer holder assembly of claim 15, wherein the first fingers are formed on inner surfaces of the first rods and the second fingers are formed on inner surfaces of the second rods.

17. A wafer holder assembly configured to accommodate a plurality of wafers arranged in a vertical direction, the wafer holder assembly comprising:
a first wafer holder; and
a second wafer holder, which is configured to be received within the first wafer holder;

wherein, when the first wafer holder moves vertically upward relative to the second wafer holder, the first wafer holder is configured to support respective backsides of the plurality of wafers, and the second wafer holder is free of contact with the plurality of wafers; and wherein, when the second wafer holder moves vertically upward relative to the first wafer holder, the second wafer holder is configured to support the respective backsides of the plurality of wafers, and the first wafer holder is free of contact with the plurality of wafers;

wherein the first wafer holder comprises a plurality of first rods that extend vertically and are positioned near a periphery of the first wafer holder, and wherein each of the first support rods has a radial outer surface aligned with an outer radial boundary of the first wafer holder; and wherein each of the first rods comprises a plurality of first fingers arranged along a vertical direction at intervals; wherein the second wafer holder comprises a plurality of second rods that extend vertically and are positioned near a periphery of the second wafer holder, and each of the second support rods has a radial outer surface aligned with an outer radial boundary of the second wafer holder; and wherein each of the second rods comprises a plurality of second fingers arranged along the vertical direction at intervals.

18. The wafer holder assembly of claim 17, wherein, when the first wafer holder supports the respective bottom surfaces of the plurality of wafers, a group of the first fingers located at a same horizontal level is configured to collectively contact and support one of the plurality of wafers, and wherein, when the second wafer holder supports respective bottom surfaces of the plurality of wafers, a group of the second fingers located at a same horizontal level is configured to collectively contact and support one of the plurality of wafers.

19. The wafer holder assembly of claim 17, wherein the first wafer holder and the second wafer holder are configured to rotate relative to each other to change a positional relationship between the plurality of first rods and the plurality of second rods.

20. The wafer holder assembly of claim 19, wherein, from a bottom view perspective, the plurality of first rods do not overlap with the plurality of second rods.

\* \* \* \* \*